United States Patent
Uchida

(10) Patent No.: US 9,709,381 B2
(45) Date of Patent: Jul. 18, 2017

(54) SURFACE EMITTING LASER AND OPTICAL COHERENCE TOMOGRAPHY APPARATUS INCLUDING THE SAME

(71) Applicant: CANON KABUSHIKI KAISHA, Tokyo (JP)

(72) Inventor: Takeshi Uchida, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 225 days.

(21) Appl. No.: 14/552,081

(22) Filed: Nov. 24, 2014

(65) Prior Publication Data
US 2015/0198431 A1    Jul. 16, 2015

(30) Foreign Application Priority Data
Nov. 27, 2013 (JP) ................... 2013-244996

(51) Int. Cl.
*G01B 9/02* (2006.01)
*H01S 5/183* (2006.01)
*H01S 5/12* (2006.01)

(52) U.S. Cl.
CPC ..... *G01B 9/02091* (2013.01); *G01B 9/02002* (2013.01); *H01S 5/18366* (2013.01);
(Continued)

(58) Field of Classification Search
CPC .............. G01B 9/02091; G01B 9/0209; G01B 9/02002; H01S 5/18366; H01S 5/1221;
(Continued)

(56) References Cited

U.S. PATENT DOCUMENTS

| 7,307,719 B2 * | 12/2007 | Wang ..................... G01J 3/26 356/301 |
| 2003/0107034 A1 * | 6/2003 | Viktorovitch ........ G02B 26/001 257/37 |

(Continued)

FOREIGN PATENT DOCUMENTS

JP    2004-281733 A    10/2004

OTHER PUBLICATIONS

Chang-Hasnain, Connie J.; "Tunable VCSEL;" IEEE Journal on Selected Topics in Quantum Electronics, vol. 6, No. 6, Nov./Dec. 2000, pp. 978-987.

*Primary Examiner* — Tarifur Chowdhury
*Assistant Examiner* — Jonathon Cook
(74) *Attorney, Agent, or Firm* — Canon USA, Inc. IP Division

(57) ABSTRACT

A surface emitting laser includes a lower reflector, an active layer, a gap portion, and an upper reflector, which are arranged in that order, and a driving unit. The surface emitting laser is capable of varying a wavelength of emitted light by changing a distance between the upper and lower reflectors. The driving unit moves one of the upper and lower reflectors in an optical axis direction of the emitted light. When $\lambda_g$ is a wavelength at which a gain at a time of laser oscillation of the active layer is at a maximum, $\lambda_0$ is a center wavelength of the emitted light, and $\lambda_r$ is a wavelength at which a reflectance of one of the upper and lower reflectors from which the light is emitted is at a maximum, $\lambda_r < \lambda_0 < \lambda_g$ or $\lambda_g < \lambda_0 < \lambda_r$ is satisfied.

19 Claims, 12 Drawing Sheets

(52) U.S. Cl.
CPC ......... *H01S 5/1221* (2013.01); *H01S 5/18308* (2013.01); *H01S 5/18341* (2013.01); *H01S 5/18361* (2013.01); *H01S 5/18369* (2013.01)

(58) Field of Classification Search
CPC ............. H01S 5/18308; H01S 5/18341; H01S 5/18361; H01S 5/18369
USPC .................................................. 356/479, 497
See application file for complete search history.

(56) References Cited

U.S. PATENT DOCUMENTS

| | | | | |
|---|---|---|---|---|
| 2003/0168667 | A1* | 9/2003 | Shigihara | H01S 5/028 257/80 |
| 2004/0202400 | A1* | 10/2004 | Kochergin | G01D 5/35316 385/12 |
| 2014/0354367 | A1* | 12/2014 | Suzuki | B82Y 20/00 331/94.1 |

* cited by examiner

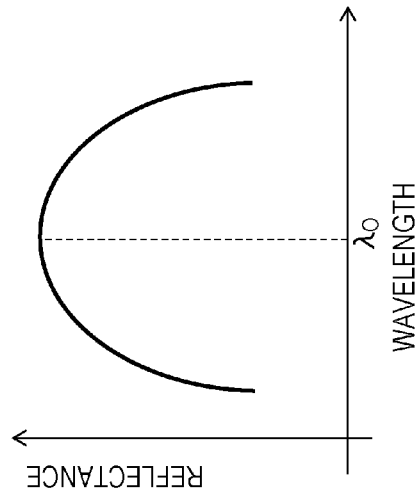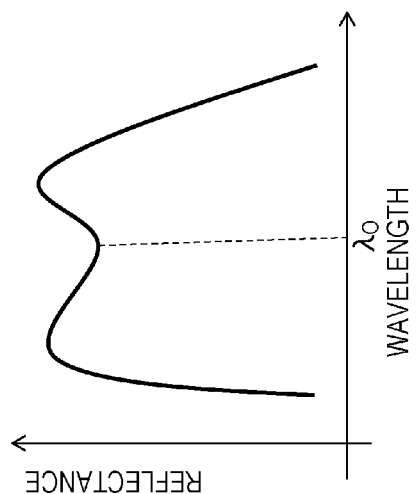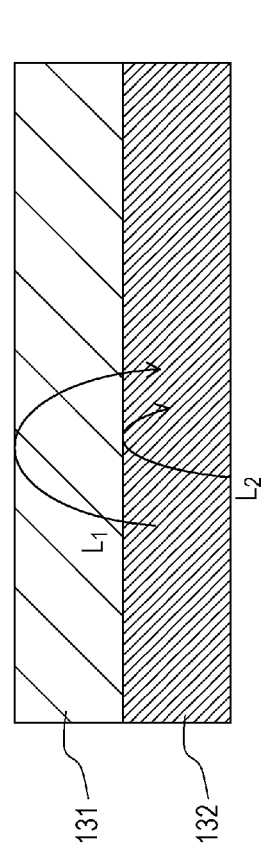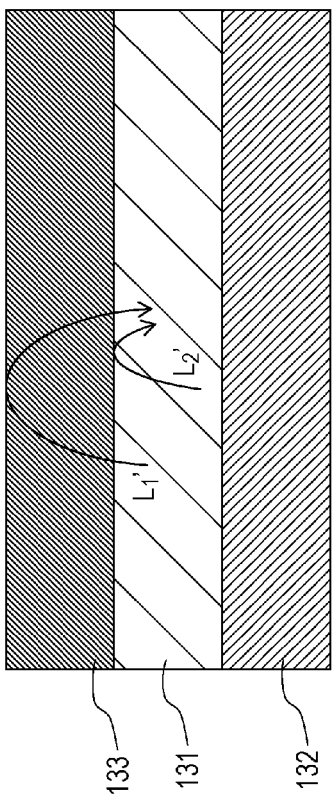

SURFACE EMITTING LASER AND OPTICAL COHERENCE TOMOGRAPHY APPARATUS INCLUDING THE SAME

BACKGROUND OF THE INVENTION

Field of the Invention

The present invention relates to a surface emitting laser and an optical coherence tomography apparatus including the surface emitting laser.

Description of the Related Art

Vertical cavity surface emitting lasers (VCSELs) are an example of surface emitting lasers. VCSELs include an active layer and two reflectors that sandwich the active layer from above and below to form a resonator in a direction perpendicular to the surface of a substrate. VCSELs emit a laser beam in the direction perpendicular to the surface of the substrate. Also, wavelength tunable VCSELs, with which the wavelength of emitted light can be varied, are known. In an example of such a VCSEL, a gap portion is provided between an upper reflector and an active layer of the VCSEL, and the wavelength of emitted light can be varied by varying the cavity length by moving the upper reflector in a direction of the optical path of the laser beam. Surface emitting lasers with which the wavelength of the emitted light can be varied are hereinafter referred to as wavelength tunable VCSELs.

It is known that wavelength tunable VCSELs are suitable for use as light sources of optical coherence tomography (OCT) apparatuses. In the case where a wavelength tunable VCSEL is used as a light source of an OCT apparatus, the tunable wavelength range of the wavelength tunable VCSEL may be increased to increase the resolution of the OCT apparatus in a thickness direction. The tunable wavelength range of the wavelength tunable VCSEL may be increased by, for example, increasing the reflectances of reflectors arranged above and below the active layer over a wide reflection range.

A wavelength tunable VCSEL in which a pair of distributed Bragg reflectors (DBRs) are arranged above and below an active layer is disclosed in IEEE Journal on Selected Topics in Quantum Electronics, Vol. 6, No. 6, Nov. 2000.

The wavelength dependency of the intensity of light emitted from a VCSEL is determined by factors such as the wavelength dependency of the gain spectrum of the active layer and the wavelength dependency of the reflectances of the upper and lower reflectors.

In an OCT apparatus including a wavelength tunable light source, it is desirable that the light output intensity of the light source does not vary by a large amount in accordance with the wavelength. Therefore, in the case where a wavelength tunable VCSEL, which is an example of a wavelength tunable light source, is included in an OCT apparatus, it is desirable that the wavelength dependency of the gain spectrum of the active layer and the wavelength dependency of the reflectances of the upper and lower reflectors may be small.

However, it is known that, in wavelength tunable VCSELs, the gain spectrum of the active layer is wavelength dependent. For example, the gain spectrum of the active layer may have a smooth convex shape in which the gain is large on the long-wavelength side of the peak wavelength. The shape of the gain spectrum of the active layer is determined by quantum mechanics, and therefore cannot be easily changed.

In the case where such a wavelength tunable VCSEL is used, the wavelength dependency of the light output intensity may be large, and there is a risk that accurate OCT images cannot be obtained.

SUMMARY OF THE INVENTION

A surface emitting laser according to an embodiment of the present invention includes a lower reflector, an active layer, a gap portion, an upper reflector, and a driving unit. The lower reflector, the active layer, the gap portion, and the upper reflector are arranged in that order. The surface emitting laser is capable of varying a wavelength of emitted light by changing a distance between the upper and lower reflectors. The driving unit moves one of the upper and lower reflectors in an optical axis direction of the emitted light. When $\lambda_g$ is a wavelength at which a gain of the active layer at a time of laser oscillation is at a maximum, $\lambda_0$ is a center wavelength of the emitted light, and $\lambda_r$ is a wavelength at which a reflectance of one of the upper and lower reflectors from which the light is emitted is at a maximum, $\lambda_r < \lambda_0 < \lambda_g$ or $\lambda_g < \lambda_0 < \lambda_r$ is satisfied.

A surface emitting laser according to another embodiment of the present invention includes a lower reflector, an active layer, a gap portion, an upper reflector, and a driving unit. The lower reflector, the active layer, the gap portion, and the upper reflector are arranged in that order. The surface emitting laser is capable of varying a wavelength of emitted light by changing a distance between the upper and lower reflectors. The driving unit moves one of the upper and lower reflectors in an optical axis direction of the emitted light. When $\lambda_s$ is a light emission wavelength of a ground level of the active layer, $\lambda_0$ is a center wavelength of the emitted light, and $\lambda_r$ is a wavelength at which a reflectance of one of the upper and lower reflectors from which the light is emitted is at a maximum, $\lambda_r < \lambda_0 < \lambda_s$ or $\lambda_s < \lambda_0 < \lambda_r$ is satisfied.

A surface emitting laser according to yet another embodiment of the present invention includes a lower reflector, an active layer, a gap portion, an upper reflector, and a driving unit. The lower reflector, the active layer, the gap portion, and the upper reflector are arranged in that order. The surface emitting laser is capable of varying a wavelength of emitted light by changing a distance between the upper and lower reflectors. The driving unit moves one of the upper and lower reflectors in an optical axis direction of the emitted light. When $G(\lambda)$ is a wavelength dependency of a gain of the active layer and $R(\lambda)$ is a wavelength dependency of a reflectance of one of the upper and lower reflectors from which the light is emitted, a region in which $d^2G(\lambda)/d\lambda^2 < 0$ is satisfied and a region in which $d^2R(\lambda)/d\lambda^2 > 0$ is satisfied at least partially overlap.

Further features of the present invention will become apparent from the following description of exemplary embodiments with reference to the attached drawings.

BRIEF DESCRIPTION OF THE DRAWINGS

FIGS. 6A to 6D are diagrams for describing the mechanism that yields the effects of the wavelength tunable VCSEL according to the embodiment of the present invention.

DESCRIPTION OF THE EMBODIMENTS

Figure 1:
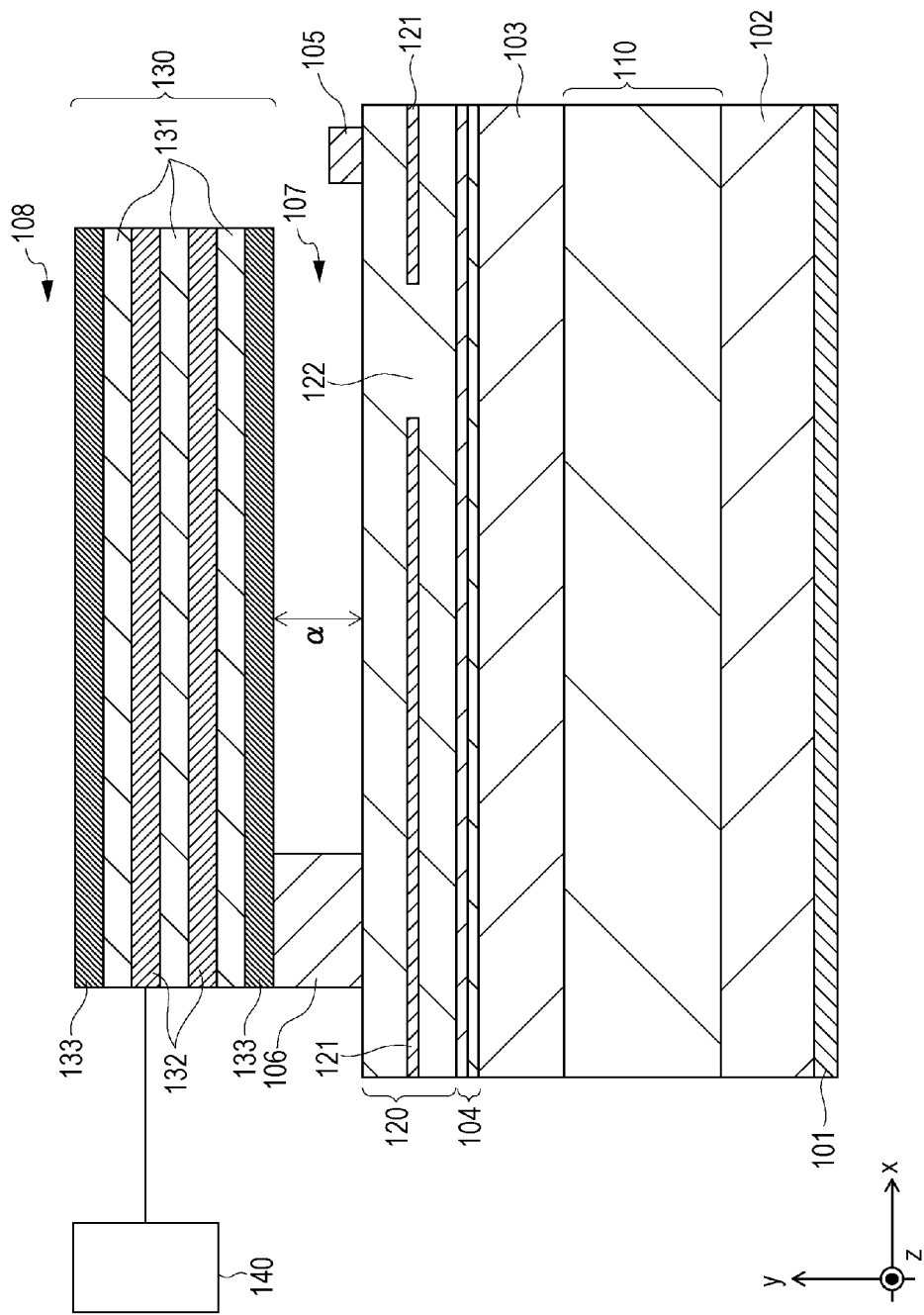
FIG. 1 is a sectional view illustrating the structure of a wavelength tunable VCSEL according to an embodiment of the present invention.

A wavelength tunable VCSEL according to an embodiment of the present invention will now be described. FIG. 1 is a sectional view of a surface emitting laser according to the present embodiment.

As illustrated in FIG. 1, the surface emitting laser according to the present embodiment includes a lower electrode 101, a substrate 102 formed on the lower electrode 101, a lower reflector 110 formed on the substrate 102, a lower cladding layer 103 formed on the lower reflector 110, an active layer 104 formed on the lower cladding layer 103, an upper cladding layer 120 formed on the active layer 104, and an upper electrode 105 formed on the upper cladding layer 120. A support layer 106 (semi-insulating layer) is formed on the upper cladding layer 120, and an upper reflector 130 is formed on the support layer 106. The upper cladding layer 120 and the upper reflector 130 are separated from each other, and a gap portion 107 is provided therebetween. When a current is applied to the active layer 104 by the lower electrode 101 and the upper electrode 105, light is emitted. The emitted light reciprocates in a resonator formed of the lower reflector 110 and the upper reflector 130, so that stimulated emission occurs. As a result of the stimulated emission in the resonator, the light is emitted through the upper reflector 130 in a direction perpendicular to the surface of the substrate 102, that is, in a y direction, as a laser beam having a certain wavelength. The upper cladding layer 120 includes a current blocking layer 121. Therefore, the current supplied from the electrode 105 passes through an opening 122 formed in the current blocking layer 121 and flows into the active layer 104. In the present embodiment, the structure in which the gap portion 107 is provided may be one in which the upper cladding layer 120 and the upper reflector 130 are separated from each other.

When the distance from the interface between the upper cladding layer 120 and the gap portion 107 to the interface between the upper reflector 130 and the gap portion 107 (distance α in FIG. 1) is varied, the cavity length varies, and the wavelength of the oscillated laser beam varies accordingly. Therefore, the wavelength of the emitted laser beam can be varied by using a driving unit 140 that varies the distance α. In other words, the wavelength of the laser beam can be varied by moving the upper reflector 130 in an optical axis direction (y direction in FIG. 1) with the driving unit 140.

The surface emitting laser according to the present embodiment is configured such that a wavelength $\lambda_g$ at which the gain at the time of laser oscillation of the active layer is at a maximum, a center wavelength $\lambda_0$ of the emitted light, and a wavelength $\lambda_r$ at which the reflectance of the reflector at a light emission side is at a maximum satisfy $\lambda_r < \lambda_0 < \lambda_g$ or $\lambda_g < \lambda_0 < \lambda_r$. The reason why the structure having this feature is effective will now be described with reference to FIGS. 2A to 4C.

Figure 2A:
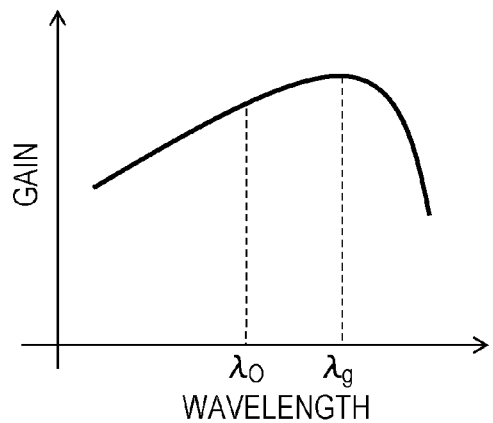
FIGS. 2A to 2C illustrate a situation of a wavelength tunable VCSEL according to the related art.
Figure 2B:
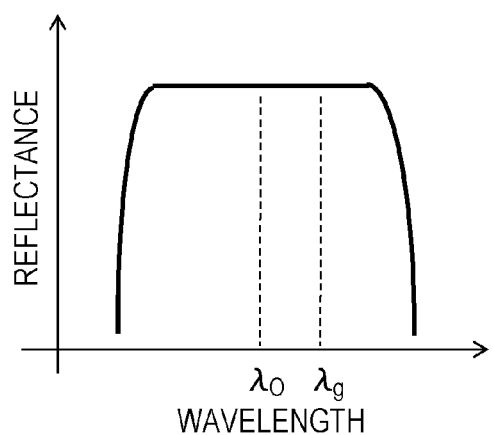
Figure 2C:
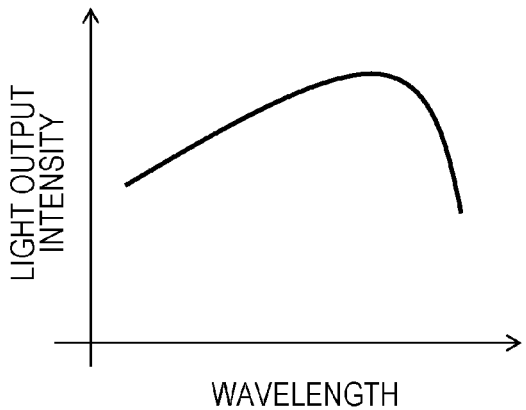

Even when the reflectance of the reflector at the light emission side is constant with respect to the wavelength in a certain wavelength range (FIG. 2B), if the wavelength $2_g$ at which the gain is at a maximum is wavelength dependent as illustrated in FIG. 2A, the intensity of the emitted light is also wavelength dependent, as illustrated in FIG. 2C. With regard to the wavelength $\lambda_g$, in general, as illustrated in FIG. 2A, the gain is large at the long-wavelength side of the center of the gain spectrum and small at the short-wavelength side of the center of the gain spectrum. Therefore, the intensity of the emitted light is large at the long-wavelength side and small at the short-wavelength side.

Accordingly, the wavelength dependency of the reflectance of the reflector at the light emission side is set in consideration of the wavelength dependency of the gain so that the wavelength dependency of the light output intensity can be reduced. Thus, the wavelength dependency of the light output intensity can be reduced.

Figure 3A:
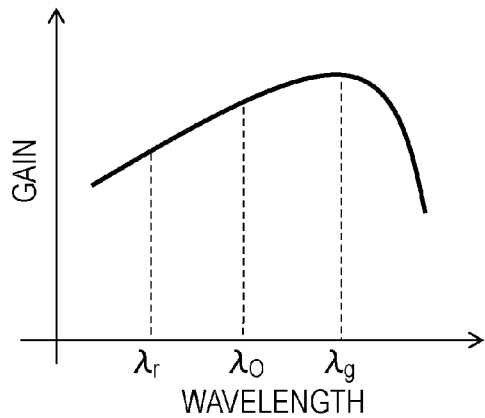
FIGS. 3A to 3C illustrate the wavelength dependencies of the gain spectrum, reflectance, and light output intensity of the wavelength tunable VCSEL according to the embodiment of the present invention.
Figure 3B:
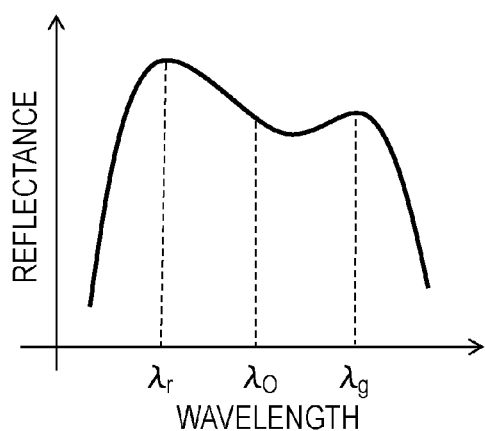
Figure 3C:
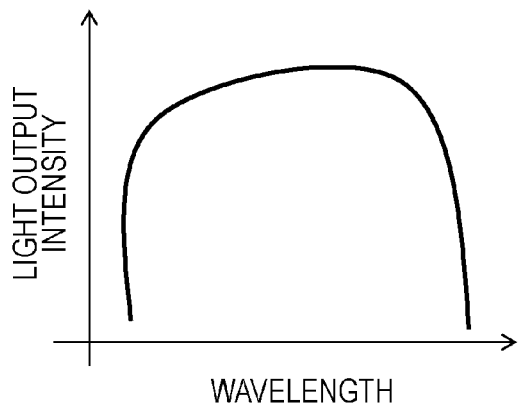

For example, in the case where $\lambda_g$ is greater than $\lambda_0$ (FIG. 3A), $\lambda_r$ may be set so as to be smaller than $\lambda_0$ (FIG. 3B). Thus, the wavelength dependency of the light output intensity can be reduced (FIG. 3C).

Figure 4A:
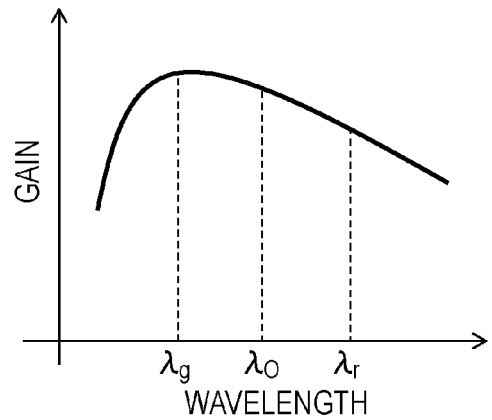
FIGS. 4A to 4C illustrate the wavelength dependencies of the gain spectrum, reflectance, and light output intensity of the wavelength tunable VCSEL according to the embodiment of the present invention.
Figure 4B:
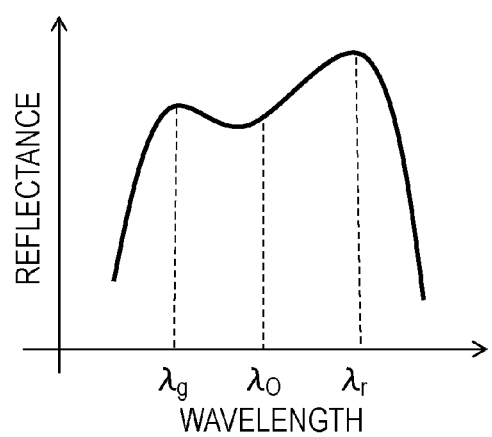
Figure 4C:
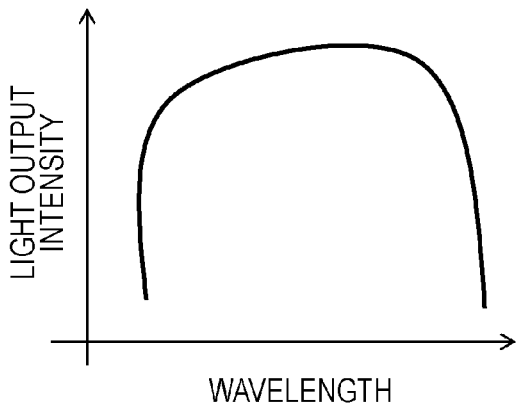

In the case where $\lambda_g$ is smaller than $\lambda_0$ (FIG. 4A), $\lambda_r$ may be set so as to be greater than $\lambda_0$ (FIG. 4B). Thus, the wavelength dependency of the light output intensity can be reduced (FIG. 4C).

A distributed Bragg reflector (DBR) is an example of a reflector that is wavelength dependent and satisfies $\lambda_0 < \lambda_r$ and $\lambda_r < \lambda_0$.

In the surface emitting laser according to the present embodiment, the lower reflector 110 and the upper reflector 130 are both DBRs. The lower reflector 110 has a multilayer structure in which high-refractive-index layers and low-refractive-index layers are alternately stacked. In the present embodiment, the upper reflector 130 is a reflector that is wavelength dependent and satisfies $\lambda_0 < \lambda_r$ and $\lambda_r < \lambda_0$.

Figure 5:
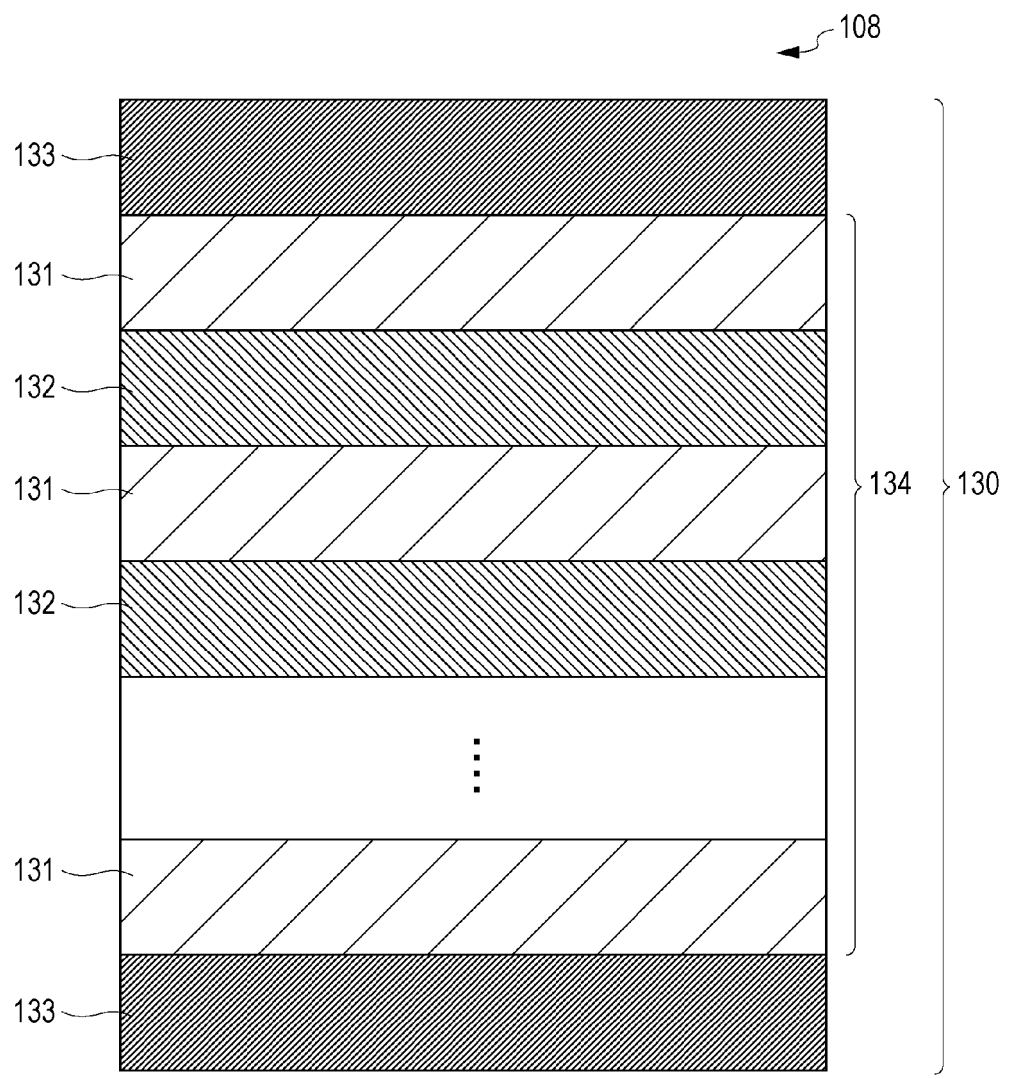
FIG. 5 is a sectional view illustrating the structure of an upper reflector according to the embodiment of the present invention.

The upper reflector 130 according to the present embodiment will now be described with reference to FIG. 5, which is an enlarged view of the upper reflector 130. The upper reflector 130 includes a stacked body 134 in which first layers 131 and second layers 132 are alternately stacked. The refractive index of the second layers 132 ($n_2$) is smaller than the refractive index of the first layers 131 ($n_1$) ($n_1 > n_2$). The outermost layers of the stacked body 134 in the stacking direction are the first layers 131. The number of layers included in the upper reflector 130 illustrated in FIGS. 1 and 5 is an example, and more layers are included in practice. The optical thickness of the first layers 131 and the second layers 132 is ¼ of the center wavelength $\lambda_0$ of the surface emitting laser according to the present embodiment.

In this specification, the center wavelength means the wavelength at the center of the wavelength range of light emitted from the surface emitting laser. In other words, the center wavelength means the middle value between the minimum wavelength and the maximum wavelength of the light emitted from the surface emitting laser. The wavelength of the light emitted from the laser is determined by factors including the variation range of the cavity length, the reflection range of the reflectors, and the gain range of the active layer. In the designing process, the center wavelength is basically set first, and then the configuration of each element is determined accordingly.

The upper reflector 130 having reflection characteristics such that the reflectance is high over a wide wavelength range can be obtained by increasing the numbers of the first layers 131 and the second layers 132 included in the upper reflector 130.

The surface emitting laser according to the present embodiment includes third layers 133 arranged on both ends of the stacked body 134. The third layers 133 have an optical thickness nd that satisfies $\lambda_0/4 < nd$ or $0 < nd < \lambda_0/4$. Each third layer 133 has a refractive index ($n_3$) that is lower than that of the first layers 131 and higher than that of one of the layers adjacent thereto (131 or 108) that is at a side opposite to a side at which the stacked body 134 is disposed, that is, higher than the refractive index of an air layer 108. The refractive indices $n_1$, $n_2$, and $n_3$ are all higher than the refractive index of the air layer 108 ($\approx 1$).

The effects of the third layers 133 will now be described with reference to FIGS. 6A to 7D. Referring to FIG. 6A, when no third layer 133 is provided, light $L_1$ reflected by the interface between a first layer 131 and an air layer 108 and light $L_2$ reflected by the interface between a second layer 132 and the first layer 131 have the same phase, and therefore enhance each other, so that reflection occurs. This is because the optical path of the light $L_1$ is longer than that of the light $L_2$ by $\lambda_0/2$, and the phase of the light $L_2$ is shifted by $\lambda_0/2$ when the light $L_2$ that has passed through the layer having a low refractive index ($n_2$) is reflected by the interface between the layer having the low refractive index ($n_2$) and the layer having a high refractive index ($n_1$). The degree of enhancement of the light is at a maximum when the wavelength is at the center wavelength $\lambda_0$. Therefore, the reflectance of the reflector is at a maximum when the wavelength is $\lambda_0$. The reflectance decreases as the wavelength increases or decreases from $\lambda_0$ (FIG. 6B).

When a third layer 133 is provided as illustrated in FIG. 6C, light $L_1'$ reflected by the interface between the third layer 133 and the air layer 108 and light $L_2'$ reflected by the interface between the first layer 131 and the third layer 133 have phases shifted from each other by $\lambda_0/2$, and therefore weaken each other, so that the reflection is suppressed. This is because the optical path of the light $L_1'$ is longer than that of the light $L_2'$ by $\lambda_0/2$, and the phase of the light $L_2'$ is not shifted when the light $L_2'$ that has passed through the layer having the high refractive index ($n_1$) is reflected by the interface between the layer having the high refractive index ($n_1$) and the layer having the low refractive index ($n_3$). The reflection suppression effect increases as the wavelength approaches the center wavelength $\lambda_0$. Therefore, the reflectance is low when the wavelength is around the center wavelength $\lambda_0$, and the reflection suppression effect decreases as the wavelength decreases or increases from the center wavelength $\lambda_0$ (FIG. 6D).

Then, when the wavelength further decreases or increases, the wavelength approaches other wavelengths at which a large reflection suppression effect occurs, and the reflectance decreases accordingly.

Figure 7A:
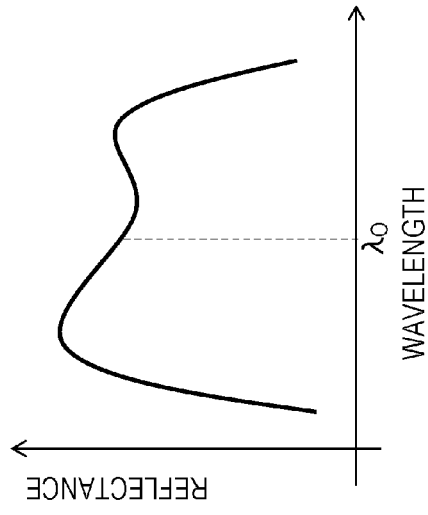
FIGS. 7A to 7D are diagrams for describing the mechanism that yields the effects of the wavelength tunable VCSEL according to the embodiment of the present invention.
Figure 7B:
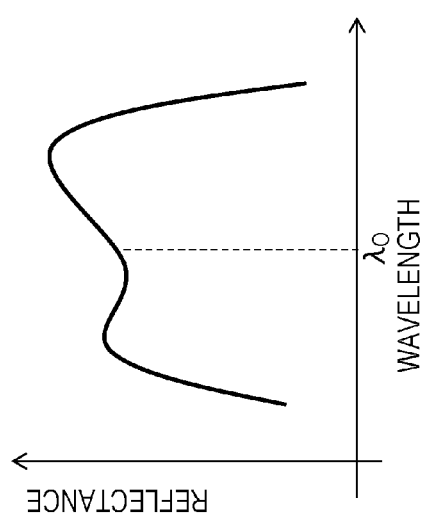

Referring to FIG. 7A, when the optical thickness of the third layer 133 satisfies $\lambda_0/4 < nd$, the reflection suppression effect is at a maximum when the wavelength is longer than the center wavelength $\lambda_0$. Therefore, as illustrated in FIG. 7B, a reflector having a low reflectance in the long-wavelength range can be obtained. This is because the reflection suppression effect is at a maximum when the optical thickness is ¼ of the wavelength, in other words, the wavelength at which a large reflection suppression effect is obtained increases as the optical thickness increases.

Figure 7C:
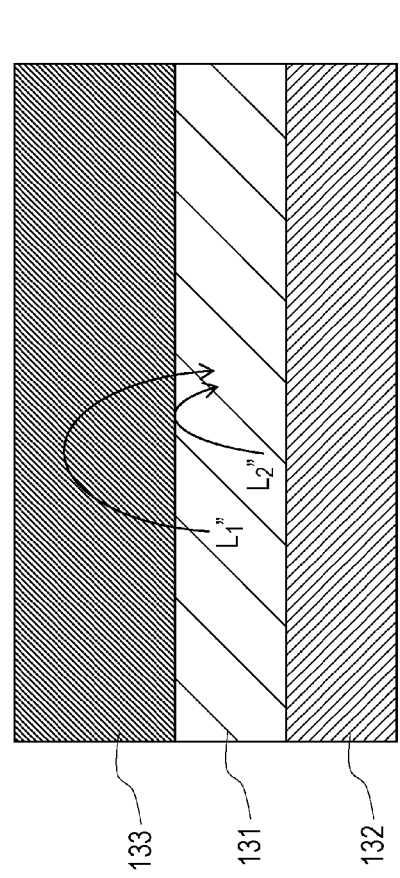
Figure 7D:
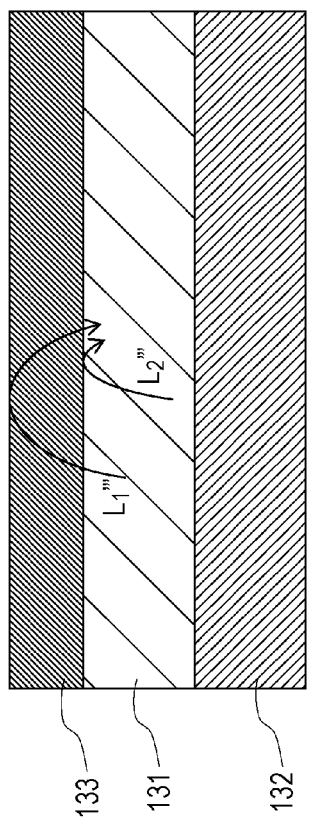

Referring to FIG. 7C, when the optical thickness of the third layer 133 satisfies $0 < nd < \lambda_0/4$, the reflection suppression effect is at a maximum when the wavelength is shorter than the center wavelength $\lambda_0$. Therefore, as illustrated in FIG. 7D, a reflector having a low reflectance in the short-wavelength range can be obtained. This is because, similar to the above-described case, the reflection suppression effect is at a maximum when the optical thickness is ¼ of the wavelength, in other words, the wavelength at which a large reflection suppression effect is obtained decreases as the optical thickness decreases.

The wavelength dependency of the light output intensity or the threshold current can be reduced when a convex portion of the graph showing the wavelength dependency of the gain spectrum of the active layer partially overlaps a concave portion of the graph showing the wavelength dependency of the reflectance of the reflector at the light emission side.

In the present embodiment, when the wavelength dependency of the gain of the active layer is $G(\lambda)$ and the wavelength dependency of the reflectance of the reflector at the light emission side is $R(\lambda)$, the region in which $d^2G(\lambda)/d\lambda^2 < 0$ is satisfied and the region in which $d^2R(\lambda)/d\lambda^2 > 0$ is satisfied at least partially overlap. As a result, the wavelength dependency of the light output intensity can be reduced.

Referring to the graphs, when an active layer having the gain spectrum shown in FIG. 3A is used, the wavelength dependency of the light output intensity can be reduced by using the reflector illustrated in FIG. 7A.

In contrast, when an active layer having the gain spectrum shown in FIG. 4A is used, the wavelength dependency of the light output intensity or the threshold current can be reduced by using the reflector illustrated in FIG. 7C. Another example of a reflector having a wavelength dependency designed in consideration of the gain spectrum (upper reflector in the present embodiment) is a light-emission-side reflector including a stacked body in which first layers and second layers are alternately stacked, the second layers having a refractive index lower than a refractive index of the first layers, outermost layers of the stacked body being the first layers. One of the first layers has an optical thickness that is greater than ½ of the center wavelength $\lambda_0$.

When one of the first layers has an optical thickness that is equal to ½ of the center wavelength $\lambda_0$, the reflection spectrum of the upper reflector is such that the reflectance is reduced at the center wavelength $\lambda_0$.

When one of the first layers has an optical thickness that is greater than ½ of the center wavelength $\lambda_0$, the reflectance is reduced at a wavelength longer than the center wavelength $\lambda_0$. Similarly, when one of the first layers has an optical thickness that is smaller than ½ of the center wavelength $\lambda_0$, the reflectance is reduced at a wavelength shorter than the center wavelength $\lambda_0$. Thus, even when no third layer is provided, the wavelength at which the reflectance is reduced can be changed by changing the optical thickness of one of the first layers, and the reflector can be designed in accordance with the gain spectrum.

The above-described ranges $\lambda_r < \lambda_0 < \lambda_g$ and $\lambda_g < \lambda_0 < \lambda_r$ in the surface emitting laser according to the present embodiment can be rewritten as $\lambda_r < \lambda_0 < \lambda_3$ and $\lambda_3 < \lambda_0 < \lambda_r$, respectively, when $\lambda_s$ is the light emission wavelength of the ground level of the active layer.

Upper Reflector and Lower Reflector

In the present embodiment, at least one of the upper and lower reflectors includes a stacked body having the above-described multilayer structure, and the upper and lower reflectors may each include a stacked body having the above-described multilayer structure. The structures and materials of the upper and lower reflectors according to the present embodiment may be selected individually.

One of the upper and lower reflectors may be a diffraction grating, for example, a high contrast grating (HCG) mirror. HCG mirrors are configured such that high-refractive-index materials and low-refractive-index materials are alternately and periodically arranged in an in-plane direction. An example of an HCG mirror includes a periodic structure formed by processing a semiconductor layer, such as an AlGaAs layer, so that periodic gap portions are formed therein. In the periodic structure, high-refractive-index regions (AlGaAs portions) and low-refractive-index regions (gap portions) are periodically arranged.

In wavelength tunable VCSELs, a mirror that is light may be used as the movable reflector (upper reflector in FIG. 1) to ensure a high wavelength tuning speed. Therefore, in the present embodiment, a thin, light HCG mirror may be used as the upper reflector instead of a thick, heavy multilayer mirror.

A dielectric multilayer film including a plurality of pairs of layers, each pair including a $SiO_2$ layer as a silicone oxide layer and a $TiO_2$ layer as a titanium oxide layer, is an example of a dielectric multilayer mirror.

In the case where a semiconductor multilayer mirror is used, that is, in the case where the first, second, and third layers are all semiconductor layers, the materials of the semiconductor layers may be those expressed as $Al_xGa_{(1-x)}As$ ($0 \leq x \leq 1$). For example, a semiconductor multilayer film including a plurality of pairs of layers, each pair including a GaAs layer as a high-refractive-index layer and an $Al_xGa_{(1-x)}As$ layer ($0.9 \leq x \leq 1$) as a low-refractive-index layer, may be used. As the high-refractive-index layers, AlAs layers, where x=1, may instead be used.

The reflectance and the width of the reflection range in which the reflectance is high can be controlled by appropriately changing the number of pairs of layers included in the multilayer mirror.

In the embodiment of the present invention, the movable mirror may have a micro electro mechanical system (MEMS) structure, such as the structure of a silicone cantilever driven by electrostatic attraction.

In the surface emitting laser according to the above-described embodiment, the upper reflector 130 is used as the reflector at the light emission side. However, the lower reflector 110 may instead be used as the reflector at the light emission side. The peak reflectance of the reflector at the light emission side is lower than that of the reflector at the other side.

In the region in which light is emitted by laser oscillation, a part of the semiconductor substrate disposed below the lower reflector 110 may be removed so that a gap portion is formed. An outermost surface layer of the lower reflector that is in contact with the air in the gap portion may be formed of the above-described third layer. In this case, the third layer has a large effect since the difference in refractive index between one surface of the outermost surface layer and the air is large.

The reflectance of the reflector at the light emission side may be in the range of 99.0% to 99.5%. In the design of a DBR, in general, the reflectance increases as the number of pairs of layers, each pair including a first layer 131 as a high-refractive-index layer and a second layer 132 as a low-refractive-index layer, increases. Therefore, when the materials of the high-refractive-index layers and low-refractive-index layers are determined, the number of pairs of layers is roughly determined. In the present embodiment, the number of pairs of layers included in the upper reflector 130 is set so as to be greater than the number of pairs of layers included in a typical DBR designed as a reflector at the light emission side. More specifically, to a DBR including a sufficient number of pairs of layers to achieve a peak reflectance of 99.5% or more, several tens of pairs of layers formed of the same materials as those of the layers included in the DBR is added. The number of pairs of layers included in the reflector at the light emission side may be such that, when the third layer is provided, the reflectance is in the optimum reflectance range, that is, in the range of 99.0% to 99.5%.

In the above-described embodiment of the present invention, the third layer 133 is in contact with the air layer 108. However, a dielectric material, such as $SiO_2$, having a refractive index lower than that of the third layers 133 may instead be used. Also when $SiO_2$ is used, there is a large difference in refractive index between $SiO_2$ and the third layer. In addition, when a dielectric material is used, the environment resistance can be increased compared to the case in which the semiconductor layer (third layer) is in direct contact with the air.

In general, in a DBR formed of dielectrics, the difference in refractive index can be more easily increased than in a DBR formed of semiconductors, and therefore a high reflectance can be obtained with a small number of layers. However, although the number of pairs of layers in the DBR formed of semiconductors is greater than that in the DBR formed of dielectrics, the DBR formed of semiconductors is beneficial with regard to processes in that deposition can be performed during crystal growth and a current can be applied by doping. In the case where the DBR is formed of semiconductors, with which it is more difficult to increase the difference in refractive index than with dielectrics, the reflectance and reflection range can be increased by increasing the number of layers. For example, 35 or more of pairs of layers, each pair including a first layer as a high-refractive-index layer and a second layer as a low-refractive-index layer, may be stacked together such that the first and second layers are alternately arranged.

Active Layer

The active layer according to the present embodiment is not particularly limited as long as the active layer emits light when a current is applied thereto. In the case where light with a wavelength range around 850 nm is to be emitted, a material having a quantum well structure made of $Al_nGa_{(1-n)}As$ ($0 \le n \le 1$) may be used. In the case where light with a wavelength range around 1060 nm is to be emitted, a material made of $In_nGa_{(1-n)}As$ ($0 \le n \le 1$) may be used.

According to the present embodiment, the active layer may have a gain over a sufficiently wide range, more specifically, over a wavelength range wider than the reflection ranges of the upper and lower reflectors. Such an active layer may be, for example, one having a quantum well structure with which light can be emitted at least at two different energy levels. The quantum well structure may include a single quantum well or a multiple quantum well formed of a plurality of layers.

The material and structure of the active layer according to the present embodiment may be selected as appropriate in accordance with the intended oscillation wavelength.

The active layer according to the present embodiment may be configured to emit light either when the active layer is excited by being irradiated with light or when a current is applied to the active layer. The surface emitting laser according to the present embodiment or an optical coherence tomography apparatus, which will be described below, may include an excitation light source for exciting the active layer or a power supply for injecting a current to the active layer.

First Cladding Layer and Second Cladding Layer

In the embodiment of the present embodiment, cladding layers are provided to trap the light and carriers. In addition, in the embodiment of the present invention, the cladding layers serve a function as spacers for adjusting the cavity length.

In the present embodiment, AlGaAs layers in which the Al composition is appropriately selected in accordance with the wavelength range of the emitted light may be used as the first and second cladding layers. For example, in the case where light with a wavelength range around 850 nm is to be emitted, $Al_{0.8}GaAs$ layers may be used. In the case where light with a wavelength range around 1060 nm is to be emitted, stacks of $Al_{0.4}GaAs$ and GaAs layers may be used. The first and second cladding layers may be of different conductivity types. With regard to the cavity length, in a wavelength-fixed VCSEL, the resonator may be a λ resonator or a long-cavity resonator having a cavity length of about 5λ, and the thicknesses of the cladding layers are adjusted to ensure sufficient cavity length. In a wavelength tunable VCSEL, in consideration of the movable range (gap portion described below) and driving of the movable mirror and the current blocking structure, the resonator may be a 3λ or 4λ resonator, and the thicknesses of the cladding layers are adjusted accordingly. The thicknesses of the first and second cladding layers are not necessarily adjusted to be equal to each other, and may be selected as appropriate as long as the cavity length can be adjusted.

Current Blocking Layer

In the present embodiment, a current blocking layer that limits the region in which a current injected to the laser flows can be provided as necessary. The current blocking layer may be formed by, for example, implanting hydrogen ions or selectively oxidizing an AlGaAs layer provided in a cladding layer and having an Al composition of 90% or more.

Gap Portion

In the present embodiment, no solid material is generally provided in the gap portion. The gap portion may be vacuum or filled with fluid, for example, air, inert gas, or liquid such as water, depending on the atmosphere of the gap portion. The length of the gap portion (α in FIG. 1) may be determined in consideration of the tunable wavelength range and pull-in of the movable mirror. For example, in a 3λ or 4λ resonator in which the gap portion is filled with air and in which the tunable wavelength range is 100 nm with 1060 nm at the center, the length of the gap portion is about 1 μm.

Driving Unit

The driving unit is not particularly limited as long as the cavity length of the wavelength tunable VCSEL according to the present embodiment can be varied. The driving unit may be configured to operate, for example, by using a MEMS mechanism in response to a voltage applied thereto or by using a piezoelectric material. Although the driving unit has a cantilever structure in the present embodiment, the driving unit may instead have a doubly supported beam structure.

The driving unit according to the present embodiment may move the upper reflector, the lower reflector, or both the upper and lower reflectors.

Optical Coherence Tomography Apparatus

Figure 8:
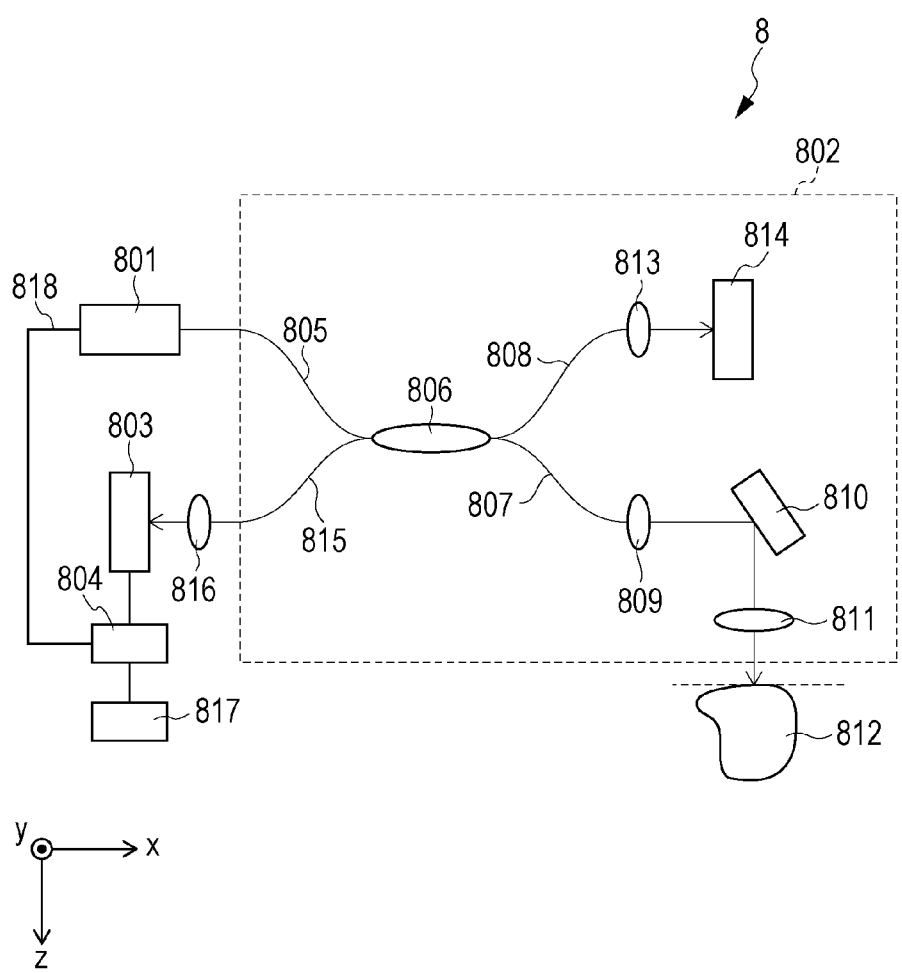
FIG. 8 illustrates the structure of an OCT apparatus including the wavelength tunable VCSEL according to the embodiment of the present invention.

An optical coherence tomography (OCT) apparatus including a wavelength tunable light source does not include a spectroscope, and is therefore expected to be capable of acquiring tomographic images with high SN ratio and low loss in the amount of light. An example in which the surface emitting laser according to the present embodiment is used as a light source unit of an OCT apparatus will now be described with reference to FIG. 8.

An OCT apparatus 8 according to the present embodiment includes at least a light source unit 801, an interference optical system 802, a light detecting unit 803, and an information acquisition unit 804. The light source unit 801 may be the above-described surface emitting laser. Although not illustrated, the information acquisition unit 804 includes a Fourier transformer. The form of the Fourier transformer included in the information acquisition unit 804 is not particularly limited as long as the information acquisition unit 804 has a function of taking the Fourier transform of data input thereto. For example, the information acquisition unit 804 may include a computing unit, and the computing unit may have a function of taking the Fourier transform. More specifically, the computing unit is a computer including a central processing unit (CPU), and the computer executes an application having a Fourier transform function. As another example, the information acquisition unit 804 may include a Fourier transform circuit having a Fourier transform function. Light emitted from the light source unit 801 passes through the interference optical system 802, and is output as interference light having information of a measurement object 812. The interference light is received by the light detecting unit 803. The light detecting unit 803 may either be a difference detecting type or simple intensity monitor type. Information regarding the temporal waveform of the intensity of the received interference light is transmitted from the light detecting unit 803 to the information acquisition unit 804. The information acquisition unit 804 acquires the peak value of the temporal waveform of the intensity of the received interference light and takes the Fourier transform to acquire information of the object 812 (for example, information of a tomographic image). Components other than the light source unit 801, the interference optical system 802, the light detecting unit 803, and the information acquisition unit 804 described herein may also be provided optionally.

Next, the operation from the oscillation of light in the light source unit 801 to acquisition of information of the tomographic image of the measurement object will be described in detail.

Light which has been emitted from the wavelength tunable light source unit 801 passes through an optical fiber 805, enters a coupler 806, where the light is divided into irradiation light which passes through an irradiation light fiber 807, and reference light which passes through a reference light fiber 808. The coupler 806 may be configured to operate in a single mode in the wavelength range of the light source, and 3 dB couplers may be uses as fiber couplers. The irradiation light passes through a collimator 809 so that the irradiation light is collimated, and is reflected by a mirror 810. The light reflected by the mirror 810 passes through a lens 811, is incident on the object 812, and is reflected by each layer of the object 812 in the depth direction of the object 812. The reference light passes through a collimator 813 and is reflected by a mirror 814. The coupler 806 generates the interference light by causing the reflected light from the object 812 and the reflected light from the mirror 814 to interfere with each other. The interference light passes through an optical fiber 815, is collected through a collimator 816, and received by the light detecting unit 803. Information regarding the intensity of the interference light received by the light detecting unit 803 is converted into electrical information such as voltage, and is transmitted to the information acquisition unit 804. The information acquisition unit 804 processes the data of the intensity of the interference light, more specifically, takes the Fourier transform of the data to acquire information of the tomographic image. The data of the intensity of the interference light subjected to the Fourier transform is normally data sampled at equal wavenumber intervals. However, data sampled at equal wavelength intervals may instead be used.

The acquired information of the tomographic image may be transmitted from the information acquisition unit 804 to an image display unit 817 and displayed as an image. A three-dimensional tomographic image of the measurement object 812 can be obtained by scanning the mirror 811 along a plane perpendicular to the direction in which the irradiation light is incident. The information acquisition unit 804 may control the light source unit 801 through an electric circuit 818. Although not illustrated in FIG. 8, the intensity of the light emitted from the light source unit 801 may be monitored, and the monitored data may be used to correct the amplitude of the signal representing the intensity of the interference light. The surface emitting laser according to the embodiment of the present invention is capable of performing laser beam oscillation over a wide wavelength range while suppressing an increase in the threshold current for emitting the laser beam. Therefore, when the surface emitting laser is included in an OCT apparatus, the current for outputting the laser beam can be reduced, and tomographic images with a high resolution in the depth direction can be obtained.

The OCT apparatus according to the embodiment is useful in obtaining a tomographic image of a living body, such as an animal or a human, in the field of ophthalmology, dentistry, dermatology, or the like. Information regarding a tomographic image of a living body includes not only a tomographic image of a living body but also numerical data required to obtain a tomographic image.

In particular, the OCT apparatus may be used to acquire information of a tomographic image of an eye-ground of a human by setting the eye-ground as a measurement object.

Other Usages

The surface emitting laser according to the embodiment of the present invention may be used not only as a light source for an OCT apparatus but also as a light source for optical communication or optical measurement.

EXAMPLES

Examples of the present invention will now be described. The structures of active layers and other structures described below are merely examples, and do not limit the scope of the invention. In addition, although specific manufacturing methods are described in the following examples, the dimensions of components of light sources, manufacturing steps, devices, and various parameters are not limited to those in the examples described below. In addition, semiconductor materials, electrode materials, dielectric materials, etc., are also not limited to those described in the examples.

First Example

The structure of a wavelength tunable VCSEL having a center wavelength of 1060 nm according to a first example will be described with reference to FIG. 1. As illustrated in FIG. 1, the wavelength tunable VCSEL according to the present example has a cantilever structure.

The surface emitting laser according to the present example includes an n-type GaAs substrate as a substrate 102, an n-type semiconductor DBR as a lower reflector 110, an InGaAs layer having a quantum well structure as an active layer 104, a GaAs layer as a support layer 106, and an n-type semiconductor DBR as an upper reflector 130.

The lower reflector 110 is structured such that 40 pairs of layers, each pair including a GaAs layer and an AlAs layer, are stacked together such that the GaAs and AlAs layers are alternately arranged.

An $Al_{0.98}Ga_{0.02}As$ layer formed by selective oxidation is used as a current blocking layer 121. Electrodes for driving the laser include an n-type electrode formed of AuGe/Ni/Au as a lower electrode 101 and a p-type electrode formed of Ti/Au as an upper electrode 105. These electrodes apply a current to the active layer 104 so that light is emitted and laser oscillation occurs. Then, when a MEMS driving process is performed by using a driving unit 140 to move the upper reflector 130 in a y direction, the wavelength of the laser beam can be changed.

Figure 9:
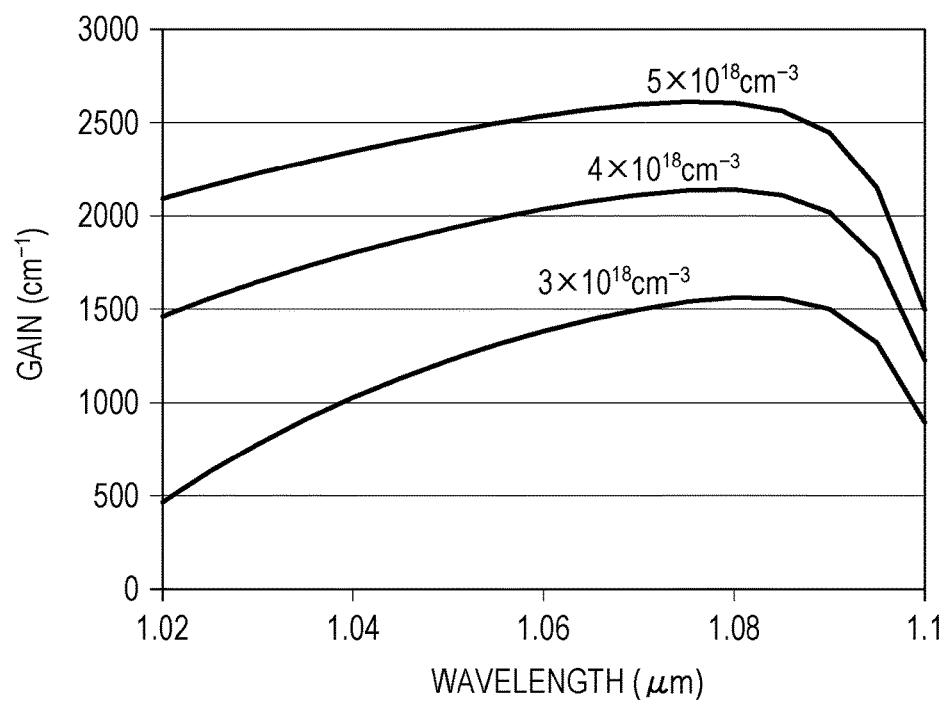
FIG. 9 is a graph of the gain spectrum of an active layer according to a first example of the present invention.

FIG. 9 shows the gain spectrum of the active layer 104 in the cases where the carrier density is $3\times10^{18}$ cm$^{-1}$, $4\times10^{18}$ cm$^{-1}$, and $5\times10^{18}$ cm$^{-1}$, which are within a standard carrier density range when a laser is operated. The active layer 104 has InGaAs/GaAs quantum wells, and three quantum wells are present in the region from the lower cladding layer 103 to the upper cladding layer 120. The wavelength of the ground level of the quantum wells is 1080 nm. It is clear from FIG. 9 that the peak gain is close to the wavelength of the ground level for all of the carrier densities. The gain rapidly decreases as the wavelength increases from 1080 nm, and gradually decreases as the wavelength decreases from 1080 nm. As described above, the gain spectrum illustrated in FIG. 9 is determined by the quantum theory, and cannot be easily changed. Accordingly, in the present example, the reflection spectrum of the upper reflector is designed in accordance with the shape of the gain spectrum illustrated in FIG. 9, so that the wavelength dependency of the light output intensity or the threshold current can be reduced.

The structure and characteristics of the upper reflector according to the present example will now be described. The upper reflector 130 according to the present example includes a stacked body in which first layers ($Al_{0.2}Ga_{0.8}As$ layers), which are high-refractive-index layers, and second layers ($Al_{0.8}Ga_{0.2}As$ layers), which are low-refractive-index layers, are alternately stacked together, outermost layers of the stacked body being the first layers. Here, 47 pairs of layers, each pair including a first layer and a second layer, and an additional first layer are provided, and therefore these layers are referred to as 47.5 pairs of layers. Third layers ($Al_{0.55}Ga_{0.45}As$) are provided on both ends of the stacked body. The optical thickness of each of the first and second layers is ¼ of the center wavelength (1060 nm), and the optical thickness of each third layer is 1/3.8 of the center wavelength (1060 nm). The refractive indices of the first, second, and third layers are $n_1=3.35$, $n_2=3.05$, and $n_3=3.14$, respectively.

Figure 10A:
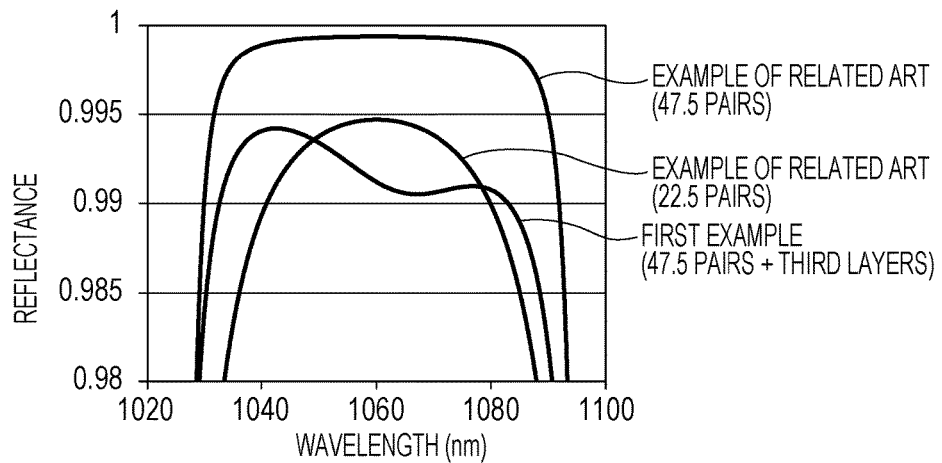
FIG. 10A is a graph showing the reflection spectrum of an upper reflector.

FIG. 10A is a graph showing the wavelength dependency of the reflectance of the upper reflector according to the present example (first example, (47.5 pairs+third layers)). FIG. 10A also shows, as examples of the related art, the wavelength dependency of the reflectance of a reflector in which 22 pairs of layers, each pair including a first layer and a second layer, and an additional first layer (22.5 pairs) are stacked together such that the first and second layers are alternately arranged and the outermost layers are the first layers, and the wavelength dependency of the reflectance of a reflector in which 47 pairs of layers, each pair including a first layer and a second layer, and an additional first layer (47.5 pairs) are stacked together such that the first and second layers are alternately arranged and the outermost layers are the first layers. It is clear that, with the upper reflector according to the present example (47.5 pairs+third layers), the reflectance is higher in the short wavelength region and lower in the long wavelength region than those in the examples of the related art (22.5 pairs and 47.5 pairs).

Figure 10B:
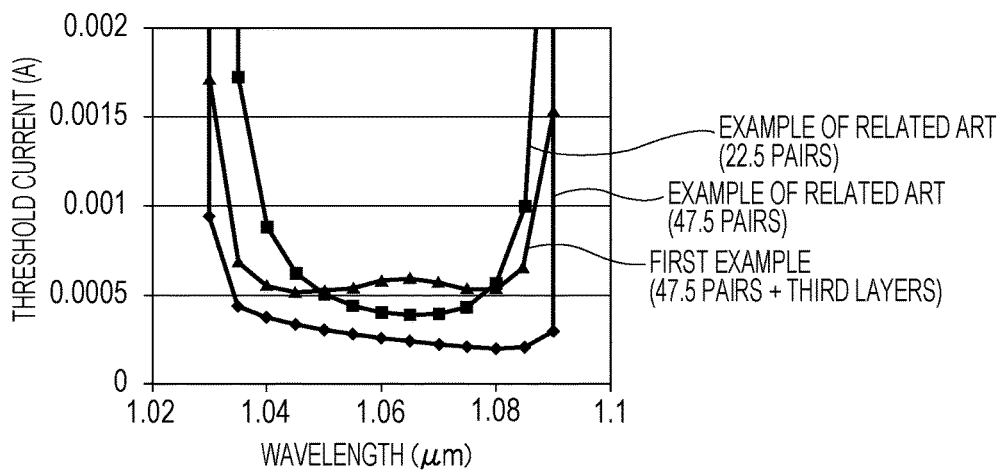
FIG. 10B is a graph showing the wavelength dependency of the threshold current of a wavelength tunable VCSEL.
Figure 10C:
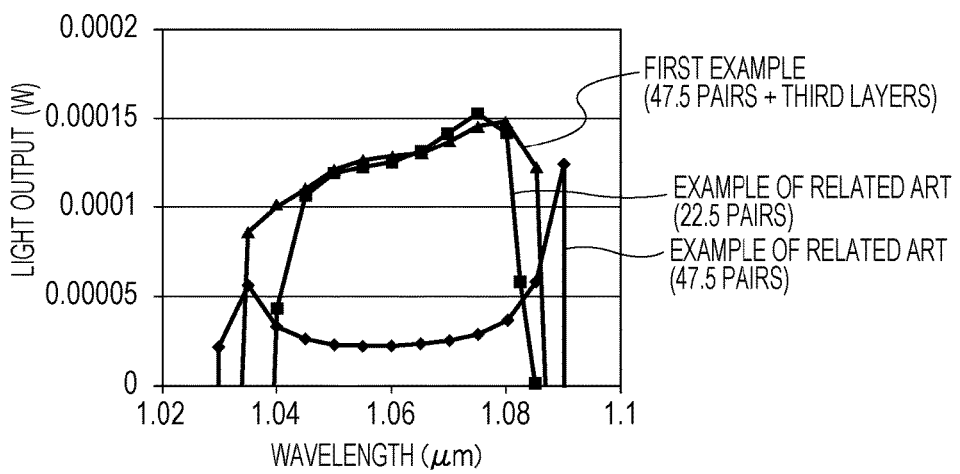
FIG. 10C is a graph showing the wavelength dependency of the light output intensity of the wavelength tunable VCSEL according to the first example of the present invention.

FIGS. 10B and 10C are graphs showing the wavelength dependencies of the threshold current and the light output intensity at the driving current (four times the threshold) of wavelength tunable VCSELs including the upper reflectors having the characteristics illustrated in FIG. 10A.

It is clear from FIG. 10B that, according to the present example, the wavelength range in which the wavelength dependency of the threshold current is small is wider than that according to an example of the related art (22.5 pairs). Also, it is clear from FIG. 10C that, according to the present example, the wavelength range in which the wavelength dependency of the light output intensity is small is around 1030 nm to around 1080 nm, which is wider than those according to the examples of the related art (22.5 pairs and 47.5 pairs).

It is clear from the above that, by using a reflector having a wavelength dependency determined in consideration of the gain spectrum, the laser characteristics can be made more stable, that is, the wavelength dependencies of the threshold current and light output intensity can be reduced compared to those in the examples of the related art.

The wavelength tunable VCSEL according to the present example can be manufactured by epitaxial growth and selective wet etching. The gap portion 107 can be formed by forming a GaAs layer as a sacrificial layer and performing selective wet etching. When a mixed solution of water, critic acid, and hydrogen peroxide is used as an etchant for GaAs, selective etching can be performed in accordance with the Al composition of AlGaAs. In the present example, a mixture of citric acid solution, obtained by mixing water and critic acid (weight ratio 1:1), and a hydrogen peroxide solution with a concentration of 30% at a ratio of 4:1 was used as the etchant. The etching time is controlled so as to leave the GaAs layer 106 that supports the beam of the upper reflector 130 and the upper reflector 130. Thus, the wavelength tunable VCSEL according to the present example is formed.

Second Example

A wavelength tunable VCSEL according to a second example of the present invention will now be described with reference to FIGS. 11A to 11C. In the second example, only the difference between the first and second examples will be described, and descriptions of common points will be omitted.

In the present example, a desired reflection spectrum is obtained only by two types of layers, which are high-refractive-index layers and low-refractive-index layers, included in an upper reflector. Here, the optical thickness of one of the high-refractive-index layers is set to 0.513 times the center wavelength. In other words, the optical thickness of one of the first layers is greater than ½ of the center wavelength $\lambda_0$. Other structures are similar to those in the first example.

Figure 11A:
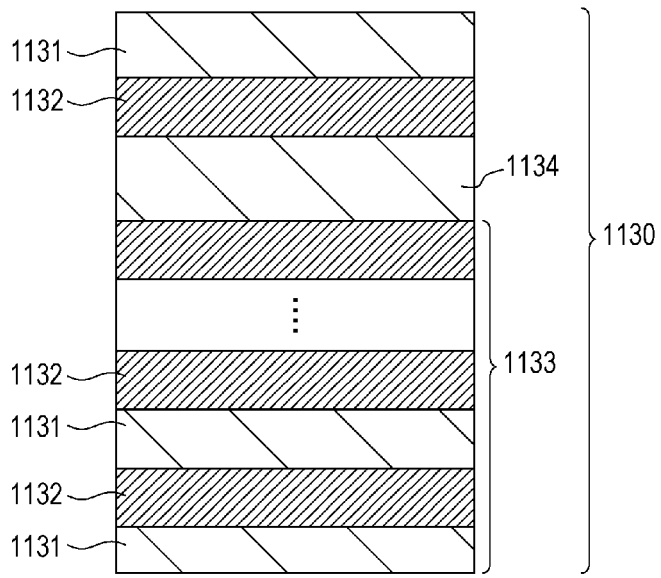
FIG. 11A is a sectional view illustrating the structure of an upper reflector.

FIG. 11A shows the structure of an upper reflector 1130. The upper reflector 1130 includes a stacked body 1133 in which 46 pairs of layers, each pair including a first high-refractive-index layer 1131 having a refractive index of 3.35 and a low-refractive-index layer 1132 having a refractive index of 3.05, are stacked together such that the first high-refractive-index layer 1131 and the low-refractive-index layer 1132 are alternately arranged. The optical thickness of each of the first high-refractive-index layers and low-refractive-index layers is ¼ of the center wavelength (1060 nm).

A second high-refractive-index layer 1134, which has a thickness of 0.513 times the center wavelength (1060 nm) and a refractive index of 3.35, is stacked on the stacked body 1133. In addition, another low-refractive-index layer 1132 and another high-refractive-index layer 1131, which are identical to those described above, are provided on the second high-refractive-index layer 1134. In other words, 47.5 pairs of layers are provided.

Figure 11B:
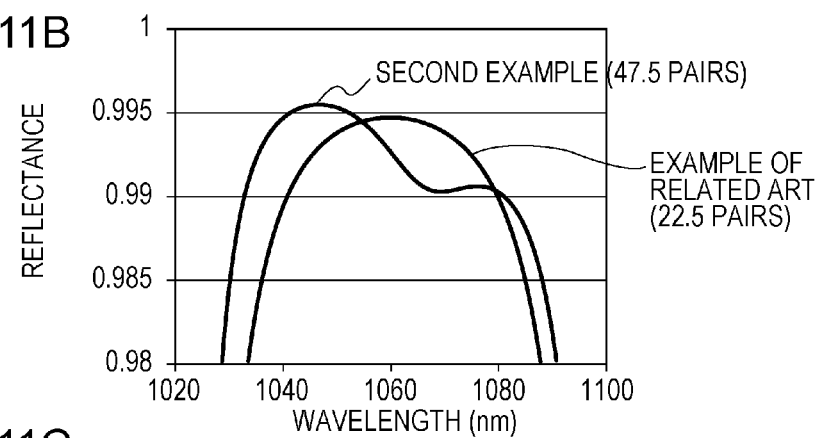
FIG. 11B is a graph showing the reflection spectrum of the upper reflector.

FIG. 11B shows the wavelength dependency of the reflectance of the above-described upper reflector. FIG. 11B also shows the reflection spectrum of the example of the related art (22.5 pairs) shown in FIG. 10A, which also shows the first example.

It is clear from FIG. 11B that, similar to the first example, also in the reflection spectrum of the upper reflector according to the present example, the peak of the reflection spectrum is on the short-wavelength side of the center wavelength.

Figure 11C:
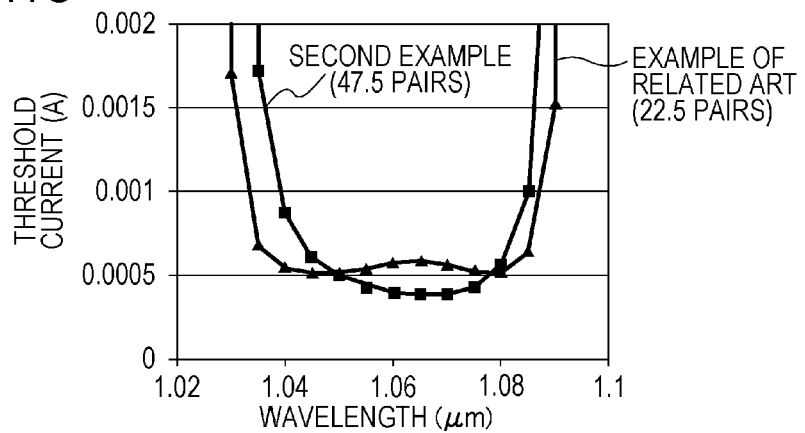
FIG. 11C is a graph showing the wavelength dependency of the threshold current of a wavelength tunable VCSEL according to a second example of the present invention.

FIG. 11C shows the threshold current of wavelength tunable VCSELs including the two types of reflectors shown in FIG. 11B. As is clear from FIG. 11C, when the reflector of the present example is used, the tunable wavelength range in which the threshold current is stable is wider than that in the case where the reflector of the example of the related art is used. Thus, according to the present example, the wavelength dependency of the light output intensity can be reduced.

Third Example

A wavelength tunable VCSEL according to a third example of the present invention will be described with reference to FIG. 12. In the third example, only the difference between the first and third examples will be described, and descriptions of common points will be omitted. In the present example, the gain of an active layer and the structure of an upper reflector differ from those in the first example.

In addition, a wavelength tunable VCSEL according to the present example differs from that of the first example in that an active layer 104 has an asymmetrical quantum well structure. Similar to the first example, the active layer 104 includes three InGaAs/GaAsQW layers having a peak gain at around 1080 nm. In addition, the active layer 104 also includes a single InGaAs/GaAsQW layer having a peak gain at around 1040 nm.

Figure 12A:
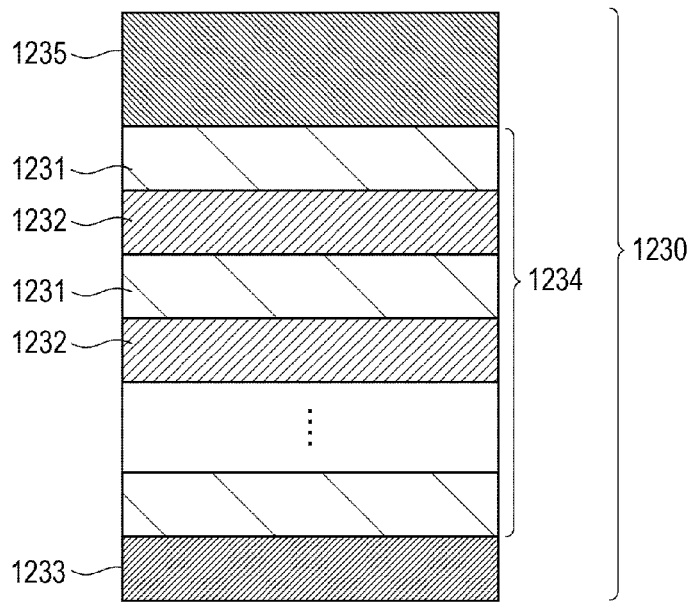
FIG. 12A is a sectional view illustrating the structure of an upper reflector.

FIG. 12A illustrates the structure of an upper reflector 1230. The upper reflector 1230 includes a stacked body 1234 in which first layers ($Al_{0.2}Ga_{0.8}As$ layers), which are high-refractive-index layers, and second layers ($Al_{0.8}Ga_{0.2}As$ layers), which are low-refractive-index layers, are alternately stacked such that the outermost layers of the stacked body 1234 are the first layers. Since 47 pairs of layers, each pair including a first layer and a second layer, and an additional first layer are provided, these layers are referred to as 47.5 pairs of layers. A first intermediate-refractive-index layer 1233, which has a refractive index of 3.1 and an optical thickness of 1/4.3 of the center wavelength (1060 nm), which is smaller than ¼ of the center wavelength (1060 nm), is provided on one side of the stacked body 1234. Also, a second intermediate-refractive-index layer 1235, which has a refractive index of 3.1 and an optical thickness of 3.92 times the center wavelength (1060 nm), which is greater than ¼ of the center wavelength (1060 nm), on the other side of the stacked body 1234.

Figure 12B:
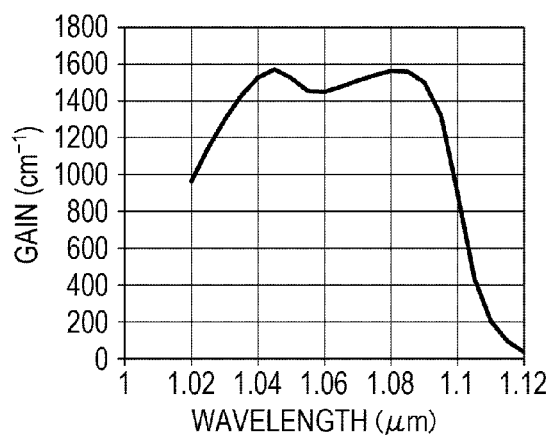
FIG. 12B is a graph showing the reflection spectrum of the upper reflector.
Figure 12C:
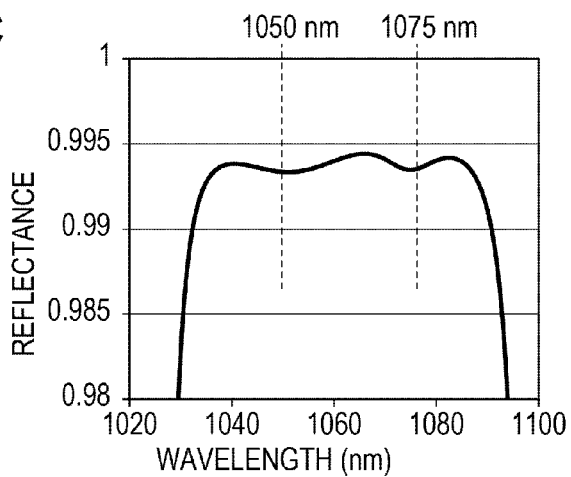
FIG. 12C is a graph showing the wavelength dependency of the threshold current of a wavelength tunable VCSEL according to a third example of the present invention.

FIG. 12B shows the wavelength dependency of the gain of the active layer according to the present example, and FIG. 12C shows the wavelength dependency of the reflectance of the upper reflector having the above-described structure. The gain spectrum of the active layer is that when the carrier density is $3 \times 10^{18}$ cm$^{-1}$. It is clear from FIG. 12C that the active layer of the present example has peak gains at around 1040 nm and around 1080 nm. In addition, it is also clear that the reflection spectrum of the upper reflector according to the present example has local minimums at 1050 nm and 1075 nm.

In the present example, since the active layer has quantum wells having different ground levels, the gain spectrum of the active layer has a plurality of peaks.

Therefore, two types of intermediate-refractive-index layers having different optical thicknesses are provided for the respective peak gains. The first intermediate-refractive-index layer 1233 has an optical thickness that is smaller than ¼ of the center wavelength, and therefore forms a region in which the reflectance is low on the short-wavelength side of the center wavelength. The second intermediate-refractive-index layer 1235 has an optical thickness that is greater than ¼ of the center wavelength, and therefore forms a region in which the reflectance is low on the long-wavelength side of the center wavelength.

With this structure, according to the above-described principle, the wavelength dependency of the light output intensity or the threshold current can be reduced.

According to an embodiment of the present invention, a surface emitting laser in which the wavelength dependency of the light output intensity or threshold current is low can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-244996 filed Nov. 27, 2013, which is hereby incorporated by reference herein in its entirety.

What is claimed is:

1. A surface emitting laser comprising:
a lower reflector;
an active layer;
a gap portion;
an upper reflector; and
a driving unit,
wherein the lower reflector, the active layer, the gap portion, and the upper reflector are arranged in that order,
wherein the surface emitting laser is capable of varying a wavelength of emitted light by changing a distance between the upper and lower reflectors,
wherein the driving unit moves one of the upper and lower reflectors in an optical axis direction of the emitted light,
wherein, $\lambda_g$ is a wavelength at which a gain at a time of laser oscillation of the active layer is at a maximum, $\lambda_0$ is a center wavelength of the emitted light, and $\lambda_r$ is a wavelength at which a reflectance of one of the upper and lower reflectors from which the light is emitted is at a maximum, $\lambda_r < \lambda_0 < \lambda_g$ or $\lambda_g < \lambda_0 < \lambda_r$ is satisfied,
wherein $\lambda_g$ is greater than $\lambda_0$ and
wherein one of the upper and lower reflectors from which the light is emitted includes
a laminated body in which first layers and second layers are stacked alternately to constitute a multilayer structure, the second layer having a refractive index lower than a refractive index of the first layer, the first layers including outermost layers of the laminated body, and
a third layer provided on at least one end of the laminated body and configured such that an optical thickness nd of the third layer satisfies $\lambda_0/4 < nd$, the third layer having a refractive index that is lower than the refractive index of the first layer and higher than a refractive index of a layer provided adjacent to the third layer at a side opposite to a side at which the laminated body is provided.

2. A surface emitting laser comprising:
a lower reflector;
an active layer;
a gap portion;
an upper reflector; and
a driving unit,
wherein the lower reflector, the active layer, the gap portion, and the upper reflector are arranged in that order,
wherein the surface emitting laser is capable of varying a wavelength of emitted light by changing a distance between the upper and lower reflectors,
wherein the driving unit moves one of the upper and lower reflectors in an optical axis direction of the emitted light,
wherein, $G(\lambda)$ is a wavelength dependency of a gain of the active layer and $R(\lambda)$ is a wavelength dependency of a reflectance of one of the upper and lower reflectors from which the light is emitted, a wavelength region satisfying $d^2G(\lambda)/d\lambda^2 < 0$ and a wavelength region satisfying $d^2R(\lambda)/d\lambda^2 > 0$ at least partially overlap, and
wherein one of the upper and lower reflectors from which the light is emitted includes
a laminated body in which first layers and second layers are stacked alternately to constitute a multilayer structure, the second layer having a refractive index lower than a refractive index of the first layer, the first layers including outermost layers of the laminated body, and a third layer provided on at least one end of the laminated body and configured such that an optical thickness nd of the third layer satisfies $\lambda_0/4 <$ nd the third layer having a refractive index that is lower than the refractive index of the first layer and higher than a refractive index of a layer provided adjacent to the third layer at a side opposite to a side at which the laminated body is provided.

3. The surface emitting laser according to claim 1, wherein $\lambda_g$ is smaller than $\lambda_0$, and wherein one of the upper and lower reflectors from which the light is emitted includes a laminated body in which first layers and second layers are alternately stacked, the second layers having a refractive index lower than a refractive index of the first layers, outermost layers of the laminated body being the first layers, and a third layer provided on at least one end of the laminated body and configured such that an optical thickness nd of the third layer satisfies $0 <$ nd $<\lambda_0/4$, the third layer having a refractive index that is lower than the refractive index of the first layers and higher than a refractive index of a layer provided adjacent to the third layer at a side opposite to a side at which the laminated body is provided.

4. The surface emitting laser according to claim 1, wherein the layer provided adjacent to the third layer is air.

5. The surface emitting laser according to claim 1, wherein the first layers, the second layers, and the third layer are all semiconductor layers.

6. The surface emitting laser according to claim 5, wherein each of the semiconductor layers includes a material expressed as $Al_xGa_{(1-x)}As(0 \le x \le 1)$.

7. The surface emitting laser according to claim 1, wherein the third layer is provided on one end of the laminated body.

8. The surface emitting laser according to claim 1, wherein the third layer is provided on each end of the laminated body.

9. The surface emitting laser according to claim 1,
wherein one of the upper and lower reflectors from which the light is emitted includes
a laminated body in which first layers and second layers are alternately stacked, the second layers having a refractive index lower than a refractive index of the first layers, outermost layers of the laminated body being the first layers, and wherein one of the first layers has an optical thickness that is greater than ½ of the center wavelength $\lambda_0$.

10. The surface emitting laser according to claim 1,
wherein one of the upper and lower reflectors from which the light is emitted includes
a laminated body in which first layers and second layers are alternately stacked, the second layers having a refractive index lower than a refractive index of the first layers, outermost layers of the laminated body being the first layers, and wherein one of the first layers has an optical thickness that is smaller than ½ of the center wavelength $\lambda_0$.

11. The surface emitting laser according to claim 1, wherein the driving unit moves the upper reflector.

12. The surface emitting laser according to claim 1, wherein the upper reflector is a diffraction grating.

13. The surface emitting laser according to claim 1, wherein the driving unit moves the lower reflector.

14. The surface emitting laser according to claim 1, wherein the active layer emits light when the active layer is excited by being irradiated with light.

15. The surface emitting laser according to claim 1, wherein the active layer emits light when a current is applied to the active layer.

16. An optical coherence tomography apparatus comprising:
a light source unit that varies a wavelength of light;
an interference optical system that divides the light from the light source into irradiation light with which an object is to be irradiated and reference light and generates interference light by causing reflected light of the irradiation light with which the object has been irradiated and the reference light to interfere with each other;
a light detecting unit that receives the interference light; and
an information acquisition unit that acquires information of the object by processing a signal from the light detecting unit,
wherein the light source unit is the surface emitting laser according to claim 1.

17. The apparatus according to claim 16,
wherein $\lambda_g$ is greater than $\lambda_0$, and
wherein one of the upper and lower reflectors from which the light is emitted includes
a laminated body in which first layers and second layers are alternately stacked, the second layers having a refractive index lower than a refractive index of the first layers, outermost layers of the laminated body being the first layers, and
a third layer provided on at least one end of the laminated body and configured such that an optical thickness nd of the third layer satisfies $\lambda_0/4 <$ nd, the third layer having a refractive index that is lower than the refractive index of the first layers and higher than a refractive index of a layer provided adjacent to the third layer at a side opposite to a side at which the laminated body is provided.

18. The apparatus according to claim 16,
wherein $\lambda_g$ is smaller than $\lambda_0$, and
wherein one of the upper and lower reflectors from which the light is emitted includes
a laminated body in which first layers and second layers are alternately stacked, the second layers having a refractive index lower than a refractive index of the first layers, outermost layers of the laminated body being the first layers, and
a third layer provided on at least one end of the laminated body and configured such that an optical thickness nd of the third layer satisfies $0 <$ nd $<\lambda_0/4$, the third layer having a refractive index that is lower than the refractive index of the first layers and higher than a refractive index of a layer provided adjacent to the third layer at a side opposite to a side at which the laminated body is provided.

19. A surface emitting laser comprising:
a lower reflector;
an active layer;
a gap portion;
an upper reflector; and
a driving unit,
wherein the lower reflector, the active layer, the gap portion, and the upper reflector are arranged in that order, wherein the surface emitting laser is capable of varying a wavelength of emitted light by changing a distance between the upper and lower reflectors, wherein the driving unit moves one of the upper and lower reflectors in an optical axis direction of the emitted light, wherein, $\lambda_s$ is a light emission wavelength of a ground level of the active layer, $\lambda_0$ is a center wavelength of the emitted light, and $\lambda_r$ is a wavelength at which a reflectance of one of the upper and lower reflectors from which the light is emitted is at a maximum, $\lambda_r < \lambda_0 < \lambda_s$ or $\lambda_s < \lambda_0 < \lambda_r$ is satisfied, and wherein $\lambda_g$ is greater than $\lambda_0$, and wherein one of the upper and lower reflectors from which the light is emitted includes a laminated body in which first layers and second layers are stacked alternately to constitute a multilayer structure, the second layer having a refractive index lower than a refractive index of the first layer, the first layers including outermost layers of the laminated body, and a third layer provided on at least one end of the laminated body and configured such that an optical thickness nd of the third layer satisfies $\lambda_0/4 <$ nd the third layer having a refractive index that is lower than the refractive index of the first layers and higher than a refractive index of a layer provided adjacent to the third layer at a side opposite to a side at which the laminated body is provided.

* * * * *